United States Patent [19]

Bowers et al.

[11] Patent Number: 4,541,076
[45] Date of Patent: Sep. 10, 1985

[54] DUAL PORT CMOS RANDOM ACCESS MEMORY

[75] Inventors: Stephen G. Bowers; Tim B. Trueblood, both of Boulder; Anthony Cabiedes, Louisville, all of Colo.

[73] Assignee: Storage Technology Corporation, Louisville, Colo.

[21] Appl. No.: 377,847

[22] Filed: May 13, 1982

[51] Int. Cl.³ .................. G11C 7/00; G11C 11/40
[52] U.S. Cl. ........................... 365/190; 365/154; 365/156; 365/189; 371/63; 364/900
[58] Field of Search ... 364/200 MS File, 900 MS File; 365/174, 181, 189, 190, 154, 156; 357/40, 42, 44, 45; 371/63, 66

[56] References Cited

U.S. PATENT DOCUMENTS

| | | | |
|---|---|---|---|
| 3,641,511 | 2/1972 | Cricchi | 365/190 |
| 4,125,877 | 11/1978 | Reinert | 365/190 |
| 4,153,942 | 5/1979 | Gregory | 364/900 |
| 4,287,575 | 9/1981 | Eardley et al. | 365/174 |
| 4,300,195 | 11/1981 | Raghunathan et al. | 364/200 |
| 4,356,504 | 10/1982 | Tozun | 357/42 |
| 4,371,932 | 2/1983 | Dinwiddie | 364/200 |
| 4,372,464 | 2/1983 | Otten | 221/14 |
| 4,395,765 | 7/1983 | Moffitt et al. | 365/174 |
| 4,402,067 | 8/1983 | Moss et al. | 365/219 |
| 4,410,964 | 10/1983 | Nordling et al. | 365/189 |
| 4,412,312 | 10/1983 | Berger et al. | 365/189 |
| 4,443,846 | 4/1984 | Adcock | 364/200 |
| 4,491,937 | 1/1985 | Chan | 365/154 |
| 4,501,003 | 2/1985 | Miller | 375/94 |

Primary Examiner—James D. Thomas
Assistant Examiner—Archie E. Williams, Jr.
Attorney, Agent, or Firm—Bryant R. Gold; James R. Young

[57] ABSTRACT

A CMOS static RAM and CMOS logic gate array are combined on a single substrate to form a new CMOS logic masterslice. The RAM includes dual port capability whereby two independent address and data paths access a common memory cell. The logic gate array includes a large number of logic blocks that may be selectively customized to provide system needed logic functions. Two metal interconnect layers are employed to provide the desired interconnections between the RAM and gate array elements. In a preferred embodiment, the masterslice contains a 128×9 dual port static RAM, 586 blocks of gate array logic (each block being the equivalent of two-2 input logic gates), 96 I/O pads, and 8 power pads. In this embodiment, the masterslice may be realized on a substrate having a size of approximately 5.8 mm by 6.05 mm, and exhibiting typical address access times of 20 ns and write pulse widths of less than 15 ns.

1 Claim, 12 Drawing Figures

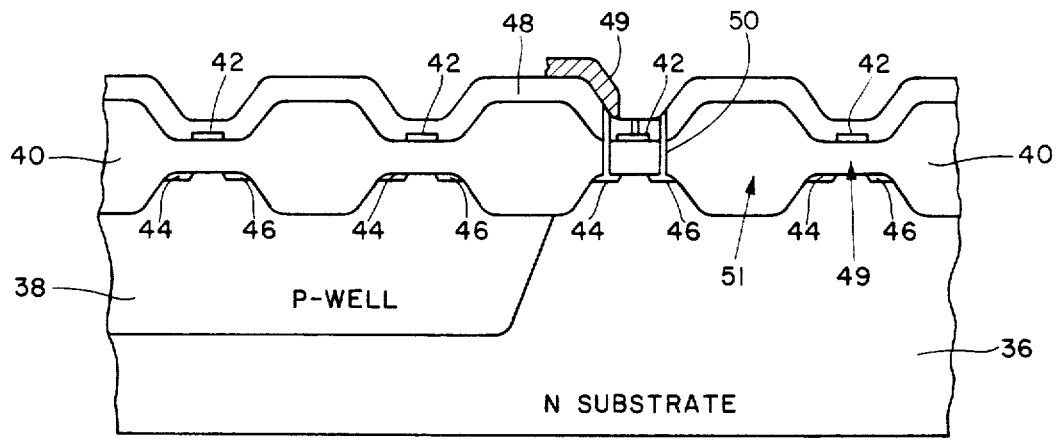
FIG. 2
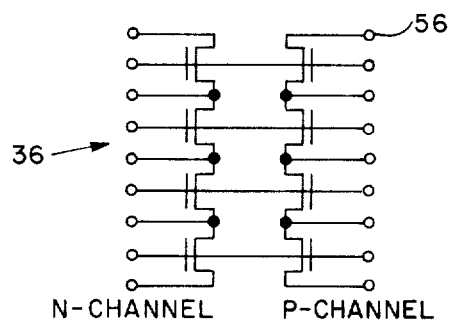
FIG. 3
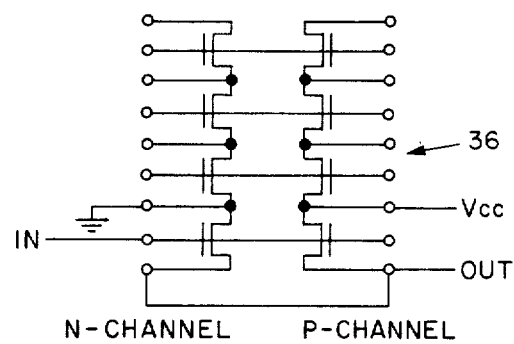
FIG. 5
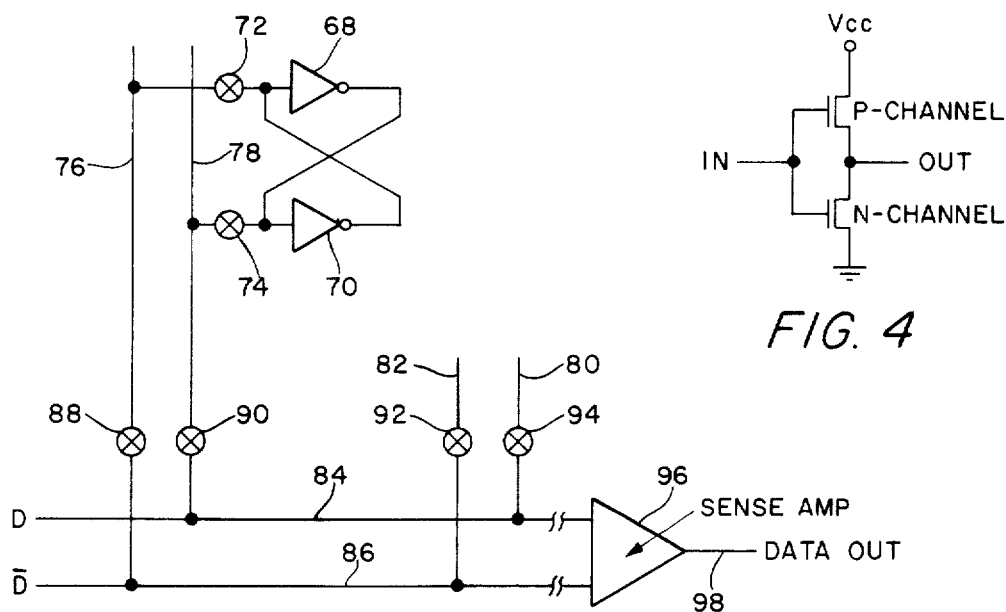
FIG. 4
FIG. 7

DUAL PORT CMOS RANDOM ACCESS MEMORY

BACKGROUND OF THE INVENTION

This invention relates to CMOS integrated circuits, and more particularly to an improved CMOS masterslice that provides, on a single chip: (1) memory elements that are readily accessable through a plurality of data ports, and (2) logic functions that can be easily customized for a particular need. The present invention therefore discloses a very versitle CMOS masterslice that can be used with a wide variety of high speed processor applications.

In recent years, CMOS (Complimentary Metal-Oxide Semiconductor) technology has become increasingly popular among circuit designers because of its low power consumption, high noise immunity, and operation over a wide power supply range. Further, a variety of new MSI and LSI functions, such as memories, microprocessors, A/D and D/A converters, telecommunication circuits, and the like, has placed CMOS among the most prominent semiconductor technologies. (For purposes of this application, MSI refers to medium scale integration integrated circuits. MSI circuits are generally considered as having at least 50-100 individual logic elements therein. LSI refers to large scale integration, and represents integrated circuits having at least 500-1000 individual logic elements therein.)

Despite the significant advantages offered by CMOS integrated circuits, the use of CMOS technology for many high speed applications has been limited because of the relatively slow operating speed of CMOS compared to other semiconductor technologies such as TTL (transistor-transistor logic) and ECL (emitter coupled logic). Although significant improvements have been made within the past few years with respect to improving the operating speed of CMOS, presently existing CMOS integrated circuits still impose undesireable limitations for the logic designer, expecially from an overall systems point of view. For example, most logic applications, especially those relating to processors, require the cyclic transfer of data from one storage device to another, typically with a intermediate processing step (i.e., the data must be shifted, added or subtracted from other data, or otherwise processed in some fashion). If such a transfer must be done quickly—at very high speeds—then existing CMOS circuits, such as memory and logic chips, are generally unsuitable because of their inherent long propagation delays between devices as a consequence of off-chip drive requirements. That is, data must be driven from the memory chip to a functional logic chip or chips (where the data can be processed), and then driven back to the memory chip. These CMOS off-chip drive requirements thus represent a significant speed limiting factor.

One approach used to minimize off-chip drive requirements, and thereby increase the speed of operation, is to put as much circuitry as possible on one chip. Hence, LSI and VLSI (very large scale integration, typically having greater than 5,000-10,000 logic elements on one chip) devices have been developed for high speed applications. Not only do such LSI and VLSI devices offer improved speed, but they also generally provide increased reliability (fewer number of parts within the system; fewer interface requirements; etc.) as well as greater packaging flexibility from a system point of view (the circuits provide more functions in a smaller space). Unfortunately, these advantages are available only at an increased cost—such LSI and VLSI are only realizable after spending a great amount of money and development time. Moreover, such devices are, by necessity, customized for a particular design application. Thus, once developed, after expending a considerable amount of engineering and processing time, these customized and inflexible devices may only be used for one application. Further, because of the huge expense involved in the development of such customized LSI and VLSI circuits, it is generally not practical to commence development of such devices unless there is some assurance that a large quantity of such devices will eventually be needed. As a practical matter, therefore, the use of customized LSI and VLSI circuits for many applications, especially lower quantity applications, is not available because either the expense is too great, or because there is insufficient development time available.

In order to alleviate the long developmental times and large expenses associated with customized LSI and VLSI devices, it is known in the art to use gate arrays to provide the logic designer with a means of quickly and less expensively customizing integrated circuits for a particular need. Gate arrays, for purposes of this application, may be considered as integrated circuits that contain arrays of logic gates or elements (realized in CMOS technology with complementary transistor pairs) that may be selectively interconnected, in a final or semi-final process step, to realize a desired logic function. As such, the lengthy and expensive developmental effort associated with designing and fabricating the logic gates or elements on a suitable substrate need only be carried out once, while the developmental effort associated with interconnecting the logic gates, realized for example by adding a metalization layer, may be customized for a particular application in a relatively short period of time and thereafter readily integrated with the final or semifinal process steps of the device.

Unfortunately, the use of gate arrays, at least the use of the type of gate arrays employed in the prior art, is generally inefficient because not all logic gates or elements are used once the gates are interconnected for a particular application. Thus, the gate array circuit device will typically end up being larger for a given application than it would be if it were realized using fully customized circuitry. For example, it is not uncommon for 40-50% of the available circuitry within a gate array device to go unused. Ideally, of course, less than 10 to 20% of such circuitry would go unused if the available space on the substrate material is to be efficiently used.

Prior art CMOS memory devices, while typically providing efficient use of available substrate space, nonetheless present some serious limitations with respect to the system architecture. That is, such memory devices, such as commercially available RAMs (random access memories) only allow one memory location to be accessed at any given time. Thus, while access to the memory is random, the access steps must typically be performed serially. This, of course, slows down operation of the overall system. Further, such commercially available RAMs represent another chip that presents off-chip drive requirements for the other integrated circuits employed within the system. As explained above, these off-chip drive requirements also reduce the system operating speed.

From the foregoing, it is evident that there is a need in the art for an integrated circuit device that not only offers the traditional advantages of LSI CMOS circuits (including low power, high noise immunity, wide range of power supply operation, high speed, improved reliability, and efficient use of available space), but that also offers the design flexibilities associated with gate arrays and flexible architecture schemes. The invention disclosed herein is directed towards a device that addresses these needs.

Accordingly, it in an object of the present invention to provide a new CMOS masterslice that offers improved design and memory access flexibility while still offering the advantages of traditional LSI CMOS circuitry (low power consumption, high noise immunity, wide range of power supply operation).

A further object of the present invention is to provide such a CMOS masterslice that may be easily, quickly, and relatively inexpensively customized to suit the needs of a particular application.

Still a further object of the present invention is to provide such a CMOS masterslice that exhibits improved speed of operation.

An additional object of the present invention is to provide a CMOS masterslice that includes an array of memory cells that can be easily and randomly accessed for reading or writing through a plurality of data and address ports, including the capability of accessing two different memory cells simultaneously at the same or at different data rates.

Still another object of the present invention is to provide such a new CMOS masterslice in a compact, efficient package that requires a minimum number of input/output (I/O) pads for interfacing with other integrated circuit packages.

SUMMARY OF THE INVENTION

The above and other objects of the present invention are realized in an improved CMOS masterslice that combines a novel CMOS static RAM and a CMOS logic gate array on the same chip. The static RAM, which may be used for a wide variety of applications, including a register file, advantageously includes two ports, either one of which may be used to read or write to any addressed location independent of the other. Thus, two different memory locations may be accessed simultaneously at the same or at different data rates. This feature provides improved design flexibility with respect to the overall system architecture in which the new masterslice is employed.

The static RAM, or register file, also includes improved access capabilities not heretofore available in conventional CMOS RAM devices. In particular, in addition to the dual port capacity, which enables data to simultanously be written into or read from a specified address through either of two ports, the present invention employs unique sensing circuitry that enables data to be sensed (read) much quicker than has previously been available.

A "Masterslice" is typically defined as an uncommitted logic array having all processing completed with the exception of the final metalization layer(s), which layer(s) provide the desired interconnections between the various logic elements of the array. The masterslice of the present invention thus includes a logic gate array that provides, on the same chip or die as the RAM, a large number of logic blocks. Each logic block can readily be customized to realize a desired logic function.

Thus, the overall masterslice design can be easily adapted to fit a particular design application. The use of the logic gate array thus provides flexibility of design as well as a means of incorporating much of the system logic on the same masterslice as the memory, thereby significantly reducing the number of off-chip drive and interface requirements. The reduction in off-chip interface requirements, as well as the improved access into the RAM, significantly improve the speed of operation of the device. Further, these features allow significant improvements in the reliability of the device, as well as the overall reliability of the system wherein the device is used, to be achieved.

The logic gate array of the present invention is realized with a large number of transistor blocks comprising complementery N-channel and P-channel transistor pairs. The transistors within a given block can readily be interconnected to perform a wide variety of logic functions. In a prefered embodiment, each transistor block is identical and advantageously includes eight transistors, four N-channel transistors and four P-channel transistors. Simple logic fucntions, such as NOR, NAND, INVERT, OR, AND, EXCLUSIVE OR, AND-OR-INVERT, and the like, are thus generally realized using one or two blocks. More complex logic functions, such as flip flops, may be realized by combining additional blocks. Interconnections between the individual transistors of a given block, or between blocks, are readily accomplished through selective application or one or more metalization layers. The realization of a custom design of the logic array is thus achieved by merely defining the metalization interconnect layers, which definition can generally be quickly and inexpensively completed, especially with the aid of a computer.

BRIEF DESCRIPTION OF THE DRAWINGS

The above and other objects, features, and advantages of the present invention will be more apparent from the following more detailed description, presented in connection with the accompanying drawings in which:

FIG. 2 shows a simplified cross section of a portion of the CMOS masterslice of FIGS. 1A and 1B;

FIG. 3 is a schematic diagram of a logic block employed within the logic gate array of the CMOS masterslice of FIGS. 1A and 1B;

FIG. 4 is a schematic diagram of a CMOS inverter circuit;

FIG. 5 shows the inverter circuit of FIG. 4 as realized using the logic gate array of FIG. 3;

FIG. 7 shows a partial logic diagram of a single port memory as employed in the prior art;

DETAILED DESCRIPTION OF THE PREFERRED EMBODIMENT

The present invention is best understood by reference to the attached drawings wherein like numerals are used to designate like parts throughout.

Figure 1A:
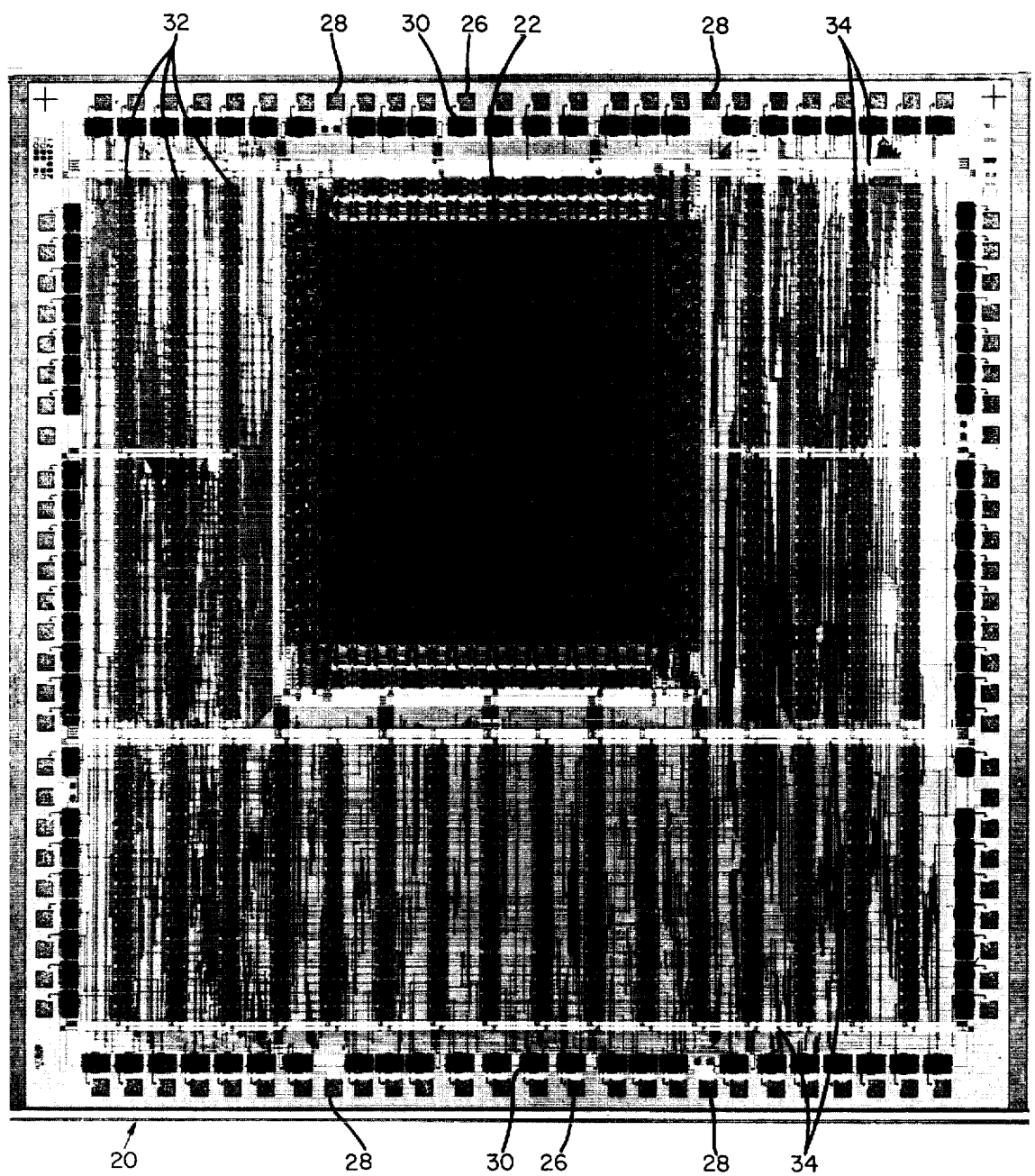
FIG. 1A is a photomicrograph of a CMOS masterslice fabricated according to the present invention, and is presented to generally illustrate the microstructure features of the invention that are incapable of being accurately or adequately depicted by a conventional drawing.
Figure 1B:
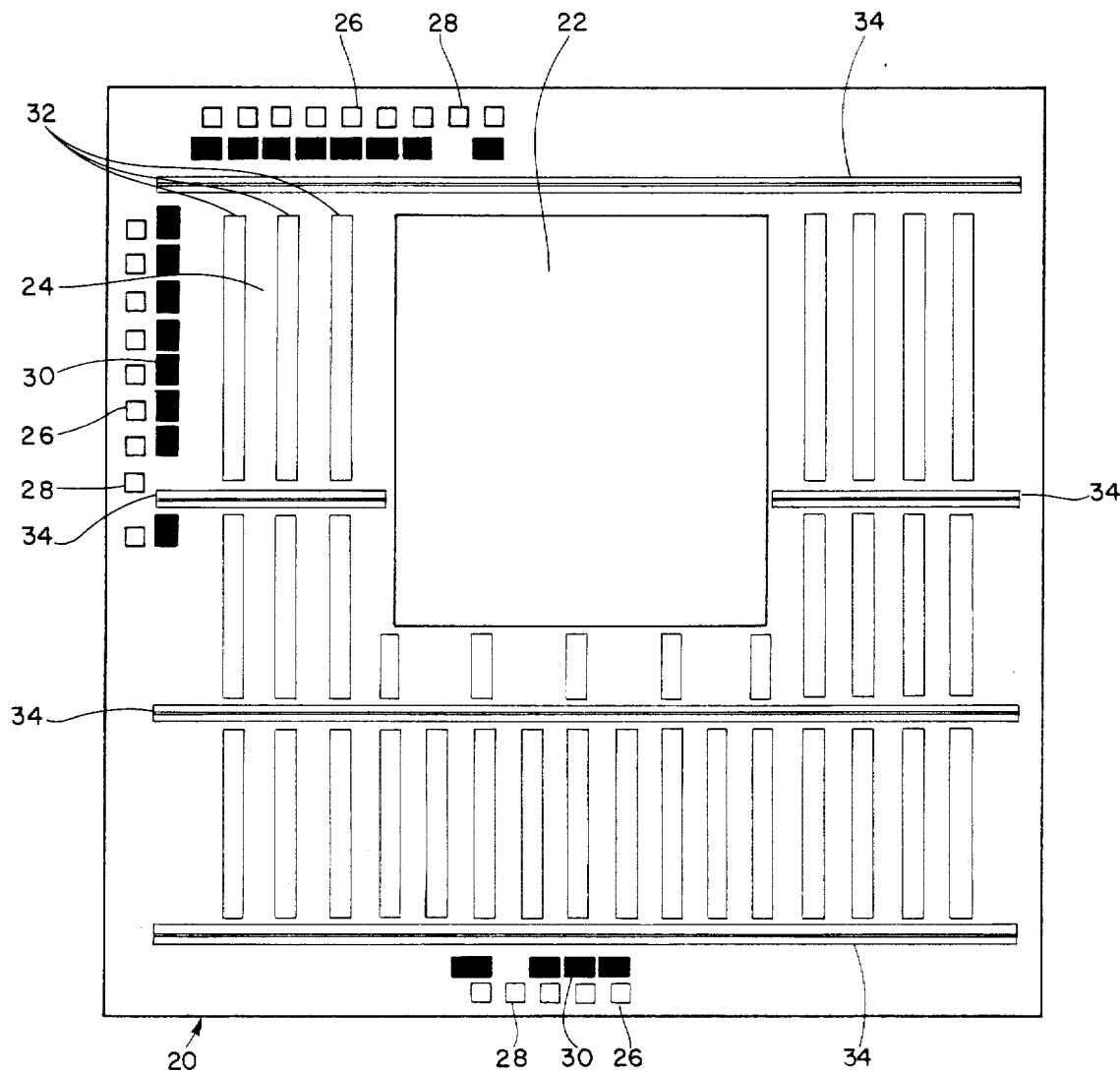
FIG. 1B is a partial top view of the CMOS masterslice of the present invention.

Referring first to FIGS. 1A and 1B, there is shown respectively a photomicrograph and a simplified drawing of a top view of a CMOS masterslice 20 built according to the present invention. The device shown in the photomicrograph of FIG. 1A has been customized for a particular design application. In this embodiment, the masterslice 20 contains a 128×9 dual port static RAM 22, 586 blocks of gate array logic 24 (occupying substantially all of the surface not occupied by the RAM 22), 96 I/O pads 26, and 8 power pads 28. Each I/O pad 26 has a buffer circuit 30 associated therewith.

The gate array logic 24 is layed out in columns, such as shown at 32. As will be explained more fully hereafter, each column 32 has a row of N-channel transistors and a row of P-channel transistors. Power buses 34 distribute power to the RAM 22 and gate array logic 24. These power buses 34 further serve to define the length of the columns 32 to approximately twenty logic cells or blocks each. An individual logic cell 36 is shown schematically in FIG. 3. Each logic cell 36 is the equivalent of two 2-input gates.

The CMOS masterslice 20, according to the preferred embodiment, may be fabricated on a die having dimensions of 228 mils (5.8 mm) by 238 mils (6.05 mm). The dual port RAM 22 occupies an area on this die of approximately 124 mils (3.2 mm) by 96 mils (2.4 mm). Advantageously, according to known CMOS processing technology, several dies may be fabricated simultaneously on a single silicon wafer. After processing, each individual die may be separated from the wafer. Each die represents an integrated circuit chip, or masterslice, that may be mounted in a suitable package with I/O pins connected to the appropriate I/O and power pads.

FIG. 2 shows a simplified partial cross sectional view of the masterslice 20. An N-type substrate 36 includes P wells 38 selectively implanted therein. A layer of silicon dioxide 40 insulates the gate from the source and drain regions 44 and 46. Typically, the gate region 42 is realized with polysilicon, and the source 44 and drain 46 are realized by selectively dopping the silicon in the desired regions. The silicon dioxide insulating layer 40 is alternately very thin (on the order of 500 angstroms) in a transistor region, such as is shown at 49, and very wide (on the order of 700 angstroms) in the region between transistors, such as is shown at 51. The wide layer of silicon dioxide 40 between transistors serves to isolate adjacent transistors. A layer of phospho-silicon glass 48 overlays the silicon dioxide 40. A two layer metal interconnect system, shown partially at 49, is then used to selectively interconnect the gate 42 and source 44 and drain 46 to desired locations. Electrical contact is made with the gate 42, the source 44, and the drain 46 by selectively tunneling through the layers of phospho-silicon glass 48 and silicon dioxide 40 as shown generally at 50, thereby allowing the metalization layer 49 to make selective electrical contact therewith.

Design and layout rules used in the fabrication of the masterslice 20 are based upon direct step on wafer (DSW) photolithography. The basic process and design characteristics associated with the DSW technology employed are summarized in Table 1.

TABLE 1

| Basic Process and Design Characteristics Employed in DSW Processing Technology of Masterslice | | | |
|---|---|---|---|
| Channel Length | 3 um | Supply Voltage | 5 V ± .5 V |
| Gate Oxide Thickness | 500 Å | 1st Metal Width | 4 um |
| NMOS VT | .9 V | 2nd Metal Width | 4 um |
| PMOS VT | 1.3 V | VIA Size | 2 um |
| Field VT's | 10 V | | |

While the preferred embodiment is processed according to the DSW technology described above, it is to be understood that other types of processing technologies known in the art could also be employed, such as electron beam processing technology.

As mentioned above, FIG. 3 is a diagram of the basic logic cell 36 employed on the masterslice 20. It consists of four N-channel and four P-channel transistors and represents the equivalent of two 2-input gates. Each point within the logic cell 36 to which electrical contact may be made is brought out to a contact point, represented as 56 in FIG. 3, to which a two layer metal interconnect system may selectively be connected. There are eighteen such contact points 56 associated with each logic cell.

By definition, there is no such thing as a descrete CMOS transistor. Rather, CMOS technology means complementary MOS transistors. Thus, the simplest CMOS device is an inverter consisting of an N-channel and P-channel transistor as shown in FIG. 4. In FIG. 4, if the input goes high (close to VCC), then the P-channel transistor will be turned off and the N-channel transistor will be turned on. Thus the output will be connected through the N-channel transistor to ground, and the output is thus low and the logical inverse of the input. Similarly, if the input goes low (close to ground potential) then the N-channel transistor is turned off and the P-channel transistor is turned on. Thus, the output is high and the logical inverse of the input.

FIG. 5 shows how a logic cell 36 could be connected in order to realize the inverter circuit of FIG. 4. As is evident from FIG. 5, the realization of an inverter circuit using a logic cell 36 only requires 2 of the 8 transistors included therein. Thus, if the only logic function one were to use were an inverter circuit, then the use of eight transistor logic cells would be inefficient. However, given the large number of logic functions that are used, such as NAND, NOR, AND-OR-INVERT, EXCLUSIVE-OR, D latches and flip-flops, and JK flip-flops, the use of 8 transistor logic cells allows, in the inventors' view, optimum usage of the available transistor pairs.

Figure 6:
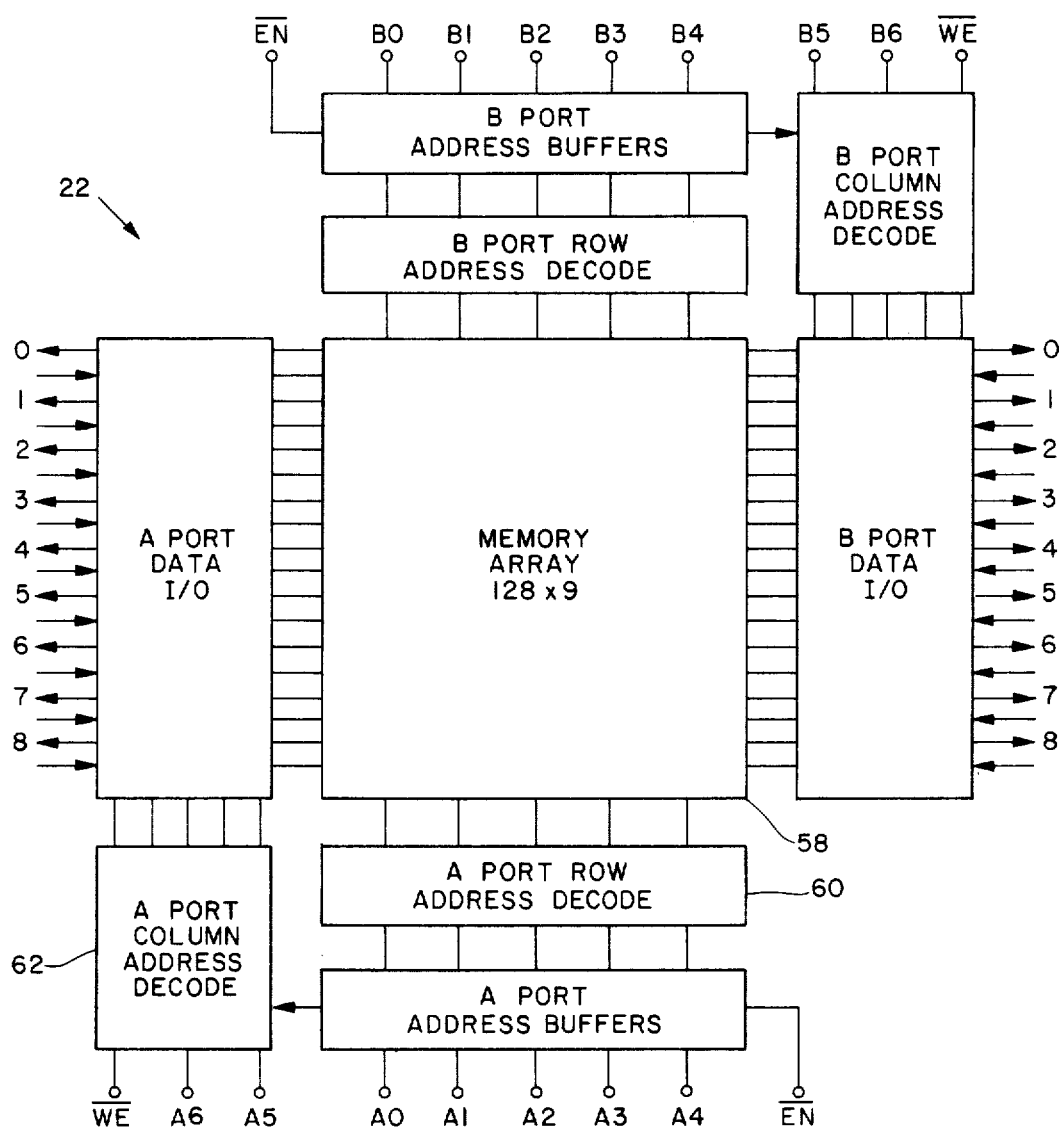
FIG. 6 is a block diagram of the dual port register file used in the CMOS masterslice of FIGS. 1A and 1B.

FIG. 6 is a block diagram of the dual port RAM 22. Each port operates independently of the other while reading and writing a common memory cell. The memory array is organized, in the preferred embodiment, as nine 32×4 arrays. Addresses A0-A4 drive a row address decode circuit 60, which is realized by a 1 of 32 word line decode. Addresses A5-A6 drive a column address decode circuit 62, which is realized simply by a 1 of 4 bit line decode. Equivalent decode circuits are utilized with respect to addresses B0-B4 and B5-B6. Nine data-in lines and nine data-out lines are connected to both the A and B data ports. Because each port operates independent of the other, two different memory words may be accessed simultaneously. Further, both the A and B ports can be operated at the same or at different data rates. Thus, the system designer has great flexibility with respect to the overall system design that is employed.

In order to better understand the operation and novelty of the dual port register file or RAM 22 that is employed with the present invention, a conventional (prior art) single port memory array is shown in FIG. 7. The memory cell is realized using a conventional cross-coupled latch circuit using inverter gates 68 and 70. Transfer gates 72 and 74 selectively provide access to the latch circuit to enable data to be written thereinto or read therefrom. Additional latch circuits, not shown, may be similarly connected to the bit lines 76 and 78 so as to form a column of latch circuits or memory cells, wherein data may be stored. Additional columns of memory cells may also similarly be connected through transfer gates to other bit lines, such as bit lines 80 and 82.

The bit lines 76 and 78 are connected to data lines 84 and 86 through additional transfer gates 88 and 90 respectively. (For purposes of this disclosure, a transfer gate may be thought of as a switch that prevents data from passing therethrough when open, and allows data to pass therethrough when closed. The design and use of transfer gates in CMOS technology is well known in the art, and will not be described herein.) Additional bit lines, such as bit lines 82 and 80 are similarly connected to the data lines 84 and 86 through transfer 92 and 94 respectively. If data is to be written into the memory cell comprised of the inverter circuits 68 and 70, then the data is placed on the data lines 84 and 86 (generally with the data signal appearing on line 84 and the complement of the data signal appearing on line 86). Transfer gates 88 and 90, as well as transfer gates 72 and 74, are then selectively closed by appropriate address signals. This allows the data to appear at the input of the latch circuit, which data forces the latch into the state represented by the data, which state is maintained until new data appears or until power is removed from the circuit. Data is read from the latch circuit by similarly closing transfer gates 72, 74, 88, and 90, so that the present state of the latch may be sensed over the data lines 84 and 86 at the sense amplifier 96. The sense amplifier 96 is typically a differential amplifier which presents a signal on the data-out line 98 representative of the data which has been sensed on the data lines 84 and 86.

One of the problems associated with the single port memory cell architecture depicted in FIG. 7 is that data must be written and sensed sequentially. That is, it is not possible to write data into a memory cell tied to bit line 76 and 78 and at the same time sense data stored in a memory cell coupled to bit lines 82 and 80. Further, due to the capacitance associated with the relatively long bit lines 76 and 78, as well as the data lines 84 and 86, there is a significant delay associated with the sense operation once the appropriate transfer gates are closed. This delay tends to slow the overall operating speed of the memory's operation.

Figure 8:
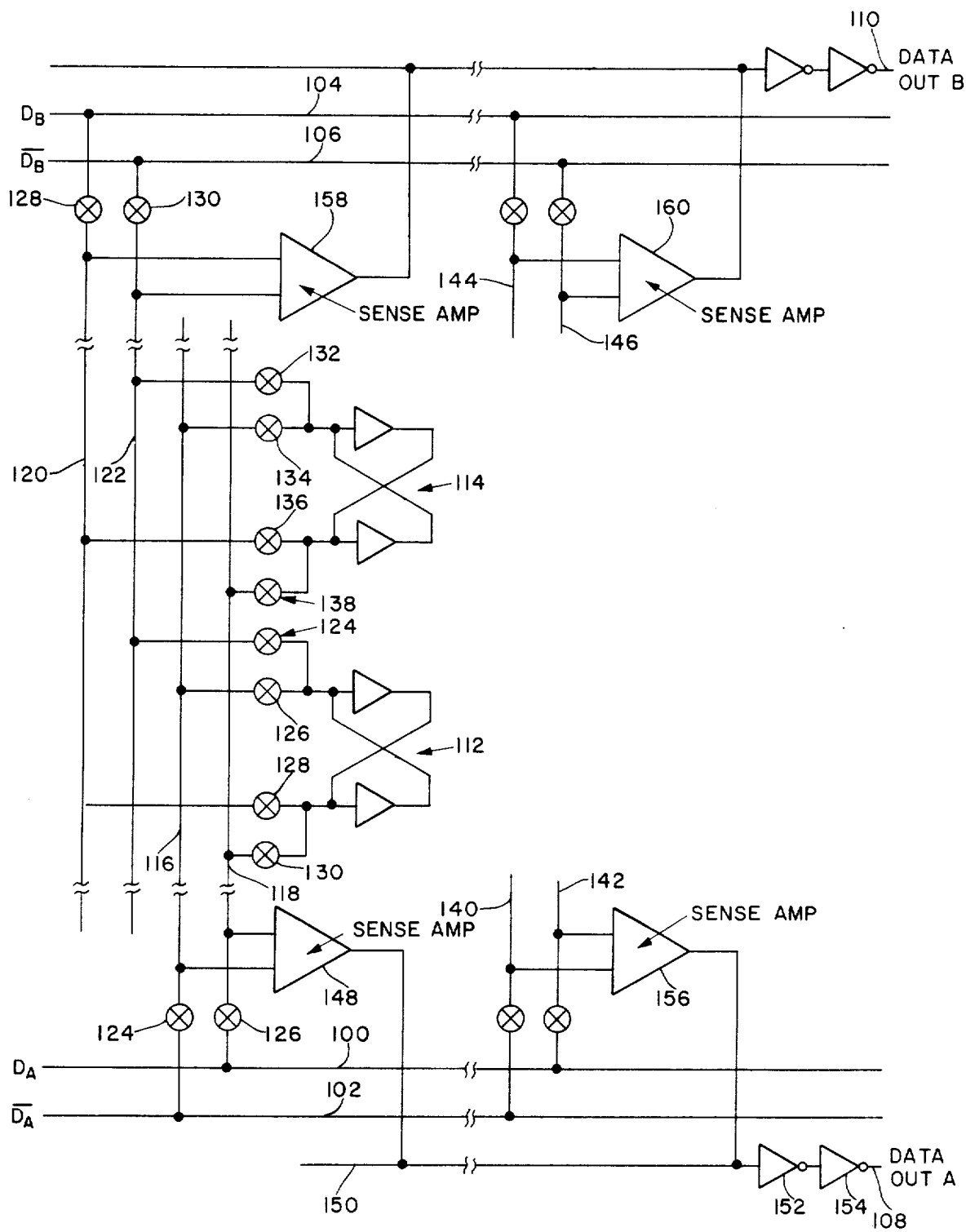
FIG. 8 is a partial logic diagram of the dual port CMOS memory employed within the present invention.

In contrast to the single port configuration depicted in FIG. 7, the dual port configuration of the present invention is logically represented in FIG. 8. In this configuration, data-in lines 100 and 102 represent part of the A port, while the data-in lines 104 and 106 represent part of the B port. These data-in lines are analagous to the data-in lines shown in FIG. 6. A column of latch circuits, represented by the 2 latch circuits 112 and 114, is coupled to the A port data-in lines 100 and 102 via bit lines 116 and 118. This same column of latched circuits is coupled to the B port data-in lines 104 and 106 via bit lines 120 and 122. Transfer gates 124 and 126 couple the bit lines 116 and 118 to the A port data-in lines 100 and 102. Similarly, transfer gates 128 and 130 couple the bit lines 120 and 122 to the B port data-in lines 104 and 106. Additional transfer gates 124, 126, 128, and 130 couple the latch circuit 112 to the bit lines 122, 116, 120, and 118 respectively. Likewise, transfer gates 132, 134, 136, and 138 couple the latch circuit 114 to the bit lines 122, 116, 120, and 118 respectively. In like fashion, each latch circuit of each column is coupled to the appropriate bit lines through respective transfer gates.

An additional column of latch circuits or memory cells, not shown, is coupled to bit lines 140, 142, 144, and 146. Further columns of memory cells may be provided as required. In the preferred embodiment, there are 9 data-in lines associated with each port. Four columns of memory cells or latch circuits are coupled, through appropriate transfer gates, to each of the 9 data-in lines. Each column has 32 memory cells associated therewith.

A separate sense amplifier for each port is coupled to the bit lines associated with each column of memory cells. The outputs of the sense amplifiers corresponding to a given port are connected to a common line, buffered, and presented as one of the nine data-out lines. For example, sense amplifier 148 is coupled to bit lines 116 and 118 at a point prior to the data-in transfer gates 124 and 126. The output of the sense amplifier 148 is tied to a common line 150 which is buffered through buffering circuits 152 and 154 and presented as the data-out line 108. A sense amplifier 156 is similarly connected to bit lines 140 and 142, and the output is also connected to the common line 150. In the preferred embodiment, up to four sense amplifiers may be connected to the common line 150. Sense amplifiers 158 and 160 are similarly connected to bit lines 120 and 122, and 144 and 146, respectively so as to present a data-out line 110 for the B port.

Figures 9, 10:
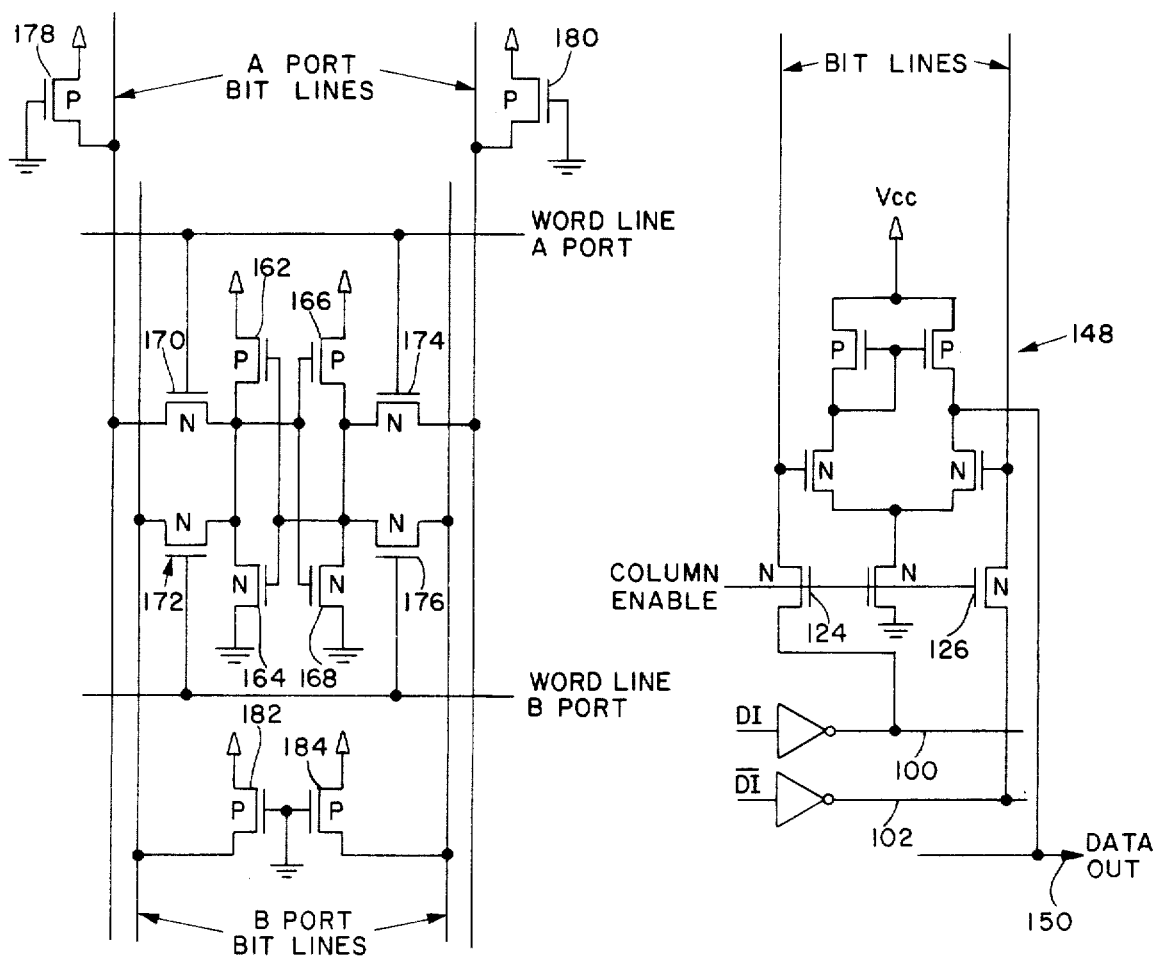
FIG. 9 is a memory cell schematic diagram according to the present invention.
FIG. 10 is a schematic diagram of the sense amplifier employed within the present invention.

The actual CMOS implementation of the memory cell is depicted in FIG. 9. Transistors 162, 164, 166, and 168 are a CMOS cross-coupled inverter cell attached to 2 independent sets of differential bit lines (labeled A port bit lines and B port bit lines) by NMOS transfer gates 170, 172, 174, and 176. The bit lines are continually charged to VCC by PMOS load devices 178, 180, 182, and 184. During a read cycle, one bit line is pulled below VCC to a voltage determined by a ratio of the pull up of the PMOS bit load and the pull down through the NMOS transfer gate and the NMOS inverter device. For a VCC of 5 volts, this voltage will typically be around 4 volts.

FIG. 10 shows the CMOS implementation of the sense amplifier employed in every column of the memory array. The numeral designations employed in FIG. 10 correspond to the sense amplifier 148 shown in FIG. 8; however, it is to be understood that all of the sense amplifiers employed within the dual port RAM circuitry 22 are preferably identical. The sense amplifier is designed to detect valid data greater than 300 mV. During a read operation, the bit lines never pull below $VCC - VTN$ (where VTN represents the threshold turn on voltage of the N channel devices), therefore the data-in transfer gates do not turn on, eliminating the effect of the capacitance of the data-in lines on the read access time.

A write operation is performed by selectively applying differential data to the data-in lines. When the data-in transfer gates are selected, one bit line will be pulled low depending upon the data which is present. This action forces the cross-coupled inverter cell to latch into a state defined by the data. When the data is removed from the data-in lines, these lines, as well as the bit lines, are charged back to VCC. Advantageously, the sense amplifiers are active during a write cycle and this allows data-out to immediately follow data-in for a given memory cell.

Figure 11:
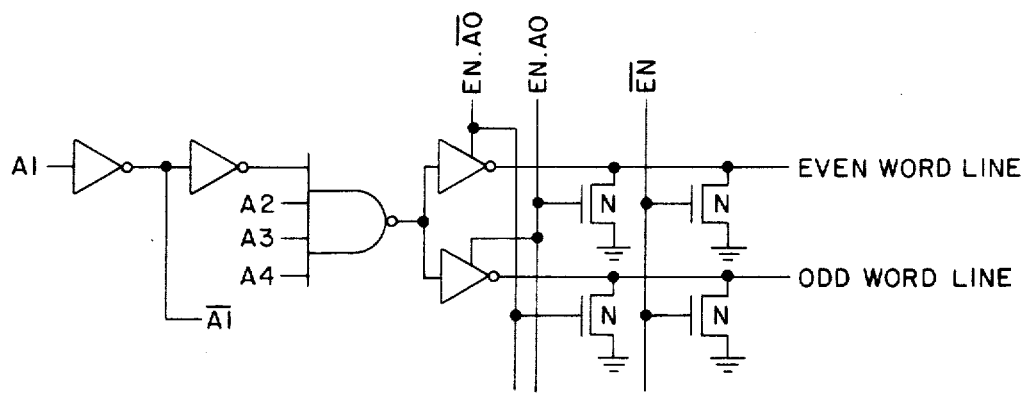
FIG. 11 is a diagram of the line decode circuits employed within the dual port CMOS memory of the present invention.

FIG. 11 shows the A port row address decode circuit 60. A similar circuit is employed for the B port row address decode circuit. This circuit uses a NAND decoder that is multiplexed to two word line drivers that are selected with A0. This aids the layout of the NAND decoder because it can be realized in a two memory cell height.

The dual port RAM 22 of the present invention provides the system designer with a flexible device that can be used for a wide variety of applications. Only two functional characteristics are of concern and these can easily be handled in the external logic design (which external logic design may be advantageously implemented in the gate array logic). The first concern is that if the same location is read from both the A and B port at the same time, there will be a degredation of the access time. This is because the memory cell is pulling low against 2 PMOS bit line loads, which causes a smaller differential signal for the sense amplifier. The second concern is that if the same memory location is written by both the A and B ports at the same time, this will cause indeterminate data to be written at that location. Other than these two concerns, the dual port RAM can read or write either the A or B port at the same time and at the same or different cycle times. This unique and useful feature has not heretofore been available, to applicants' knowledge, in any prior art CMOS device. Preliminary testing of the dual port RAM invention has indicated that typical address access times of 20 ns and write pulse widths of 12 ns have been achieved. Gate delays for the 2 input NAND function of the gate array have been measured to be around 1.5 ns.

Applications to date of the CMOS masterslice of the present invention have included:

1. A direct pin-out of the dual port RAM;

2. A first-in first-out (FIFO) memory using the dual port RAM as the storage element and using the gate array logic for control logic;

3. A multi-port data transmission register where data transmission rates are different for each port; and 4. A dual port register file for a computer peripheral controller, where the array logic is used for parity checking, instruction decode, and data bussing logic.

While the invention herein disclosed has been described by means of a specific embodiment and applications thereof, numerous modifications and variations could be made thereto by those skilled in the art without departing from the spirit and scope of the present invention. It is therefore to be understood that within the scope of the appended claims, the invention may be practiced otherwise than as specifically described herein.

What is claimed is:

1. A dual port CMOS random access memory comprising:
   a memory array comprising a plurality of memory cell columns, each column being comprised of a plurality of memory cells;
   two independent data ports coupled to each memory cell, each data port including a pair of data-in lines and a data-out line through which data may independently be written into or read from an address memory cell at a desired data rate;
   two independent address means for respectively directing data through said data ports to or from a desired memory cell in response to address signals;
   each memory cell column including two pairs of differential bit lines, one pair of bit lines being selectively coupled to said pair of data-in lines of one port, said coupling being realized with a first set of CMOS transfer gates responsive to said address means, the other pair of bit lines being selectively coupled to said pair of data-in lines of the other port, said coupling being realized with a second set of CMOS transfer gates responsive to said address means, each memory cell of said column being selectively coupled to said pairs of bit lines; and
   each memory cell column further including two sense amplifiers, each one of which is coupled to the pair of bit lines associated with one of said dual ports, said coupling occurring at a point between said first and second sets of CMOS transfer gates, the output of said sense amplifier being coupled to the data-out line of its respective port;
   whereby two different memory cells may be accessed simultaneously at the same or at different data rates.

* * * * *